(12) United States Patent
Kobayashi

(10) Patent No.: US 7,855,855 B2
(45) Date of Patent: Dec. 21, 2010

(54) RECORDING APPARATUS

(75) Inventor: Isao Kobayashi, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 802 days.

(21) Appl. No.: 11/891,499

(22) Filed: Aug. 10, 2007

(65) Prior Publication Data

US 2008/0037177 A1  Feb. 14, 2008

(30) Foreign Application Priority Data

Aug. 10, 2006 (JP) ............................. 2006-218305

(51) Int. Cl.
*G11B 21/08* (2006.01)
(52) U.S. Cl. .................................. 360/264.2
(58) Field of Classification Search .............. 360/264.2, 360/264.8, 264.3, 264.4, 265.9, 265.7, 245.9; 369/121
See application file for complete search history.

(56) References Cited

U.S. PATENT DOCUMENTS

| | | | |
|---|---|---|---|
| 5,923,501 A * | 7/1999 | Suzuki et al. ............ | 360/264.2 |
| 6,604,817 B2 | 8/2003 | Isono et al. | |
| 7,646,697 B2 * | 1/2010 | Wade et al. ................. | 369/121 |
| 2005/0206691 A1 | 9/2005 | Takata et al. | |
| 2005/0253488 A1 | 11/2005 | Ito | |
| 2007/0169136 A1 * | 7/2007 | Hiramatsu et al. ........ | 720/658 |
| 2007/0171806 A1 * | 7/2007 | Wade et al. ................ | 369/121 |

FOREIGN PATENT DOCUMENTS

| | | |
|---|---|---|
| JP | 2001-246744 | 9/2001 |
| JP | 2005-271274 | 10/2005 |
| JP | 2005-322850 | 11/2005 |

* cited by examiner

*Primary Examiner*—Allen T Cao
(74) *Attorney, Agent, or Firm*—Frommer Lawrence & Haug LLP

(57) ABSTRACT

A recording apparatus including a recording head having an actuator and operable to perform recording on a recording medium by an operation of the actuator, a head holder holding the recording head, a circuit board having a heat-conductive substrate and provided on the head holder, a drive circuit operable to drive the actuator, a flexible wiring member on which the drive circuit is mounted and which connects the circuit board and the actuator such that a signal outputted from the circuit board is transmitted to the actuator via the drive circuit, and a radiator plate provided on the head holder, held in heat conductive contact with the drive circuit, and also held in heat conductive contact with the circuit board.

20 Claims, 5 Drawing Sheets

RECORDING APPARATUS

CROSS REFERENCE TO RELATED APPLICATION

The present application claims priority from Japanese Patent Application No. 2006-218305, which was filed on Aug. 10, 2006, the disclosure of which is herein incorporated by reference in its entirety.

BACKGROUND OF THE INVENTION

1. Field of the Invention

The present invention relates generally to a recording apparatus and, in particular, to a recording apparatus having a construction in which a signal is inputted into a recording head by a flexible wiring member on which a drive circuit is mounted.

2. Discussion of Related Art

There has been conventionally known a recording apparatus in which a carriage equipped with a recording head is reciprocated in a main scanning direction (i.e., in a direction perpendicular to a direction in which a recording medium is fed) so that recording is performed on the recording medium by ejection of ink thereto from the recording head. For example, in a conventional recording apparatus disclosed by a Patent Document 1 (Japanese Unexamined Patent Application Publication No. 2005-271274, shown in FIGS. 3 and 13), a head-side circuit board mounted on the carriage is connected to the recording head via a flexible wiring member on which a drive circuit for driving the recording head is mounted. Signals from the head-side circuit board are inputted into the recording head via the drive circuit, so that the recording is performed by selectively ejecting ink from each of nozzles provided in the recording head.

However, as the signals are outputted from the drive circuit to the recording head, a large electric current momentarily passes through the drive circuit, thereby increasing a temperature (namely, a heat is generated) in the drive circuit. This heat causes deterioration or unstableness of an electrical characteristic of the drive circuit, thereby impeding the ink to be stably ejected.

Therefore, in the recording apparatus disclosed by the Patent Document 1, a radiator plate which is a plate-like member made of a metal, e.g., aluminum, is disposed on the carriage so as to be in contact with the drive circuit mounted on the flexible wiring member, thereby radiating, via the radiator plate, the heat which has been generated in the drive circuit.

SUMMARY OF THE INVENTION

In the recent years, an amount of the heat generated in the drive circuit tends to be increased since a number of the nozzles provided in the recording head has been increased according to an increase in resolution and a speed of the recording. Therefore, there has been a demand for increasing a heat capacity of the radiator plate by increasing its size in order to adequately radiate the heat generated in the drive circuit.

However, if the radiator plate is simply upsized, the recording apparatus is accordingly increased in size and weight. In this respect, there has been a limit for upsizing the radiator plate.

The present invention has been developed in view of the background discussed above. It is therefore an object of the present invention to provide a recording apparatus which is capable of satisfying the above-described demand without causing a size increase of the apparatus and in which the heat generated in the drive circuit is adequately radiated and a recording characteristic is stabilized.

To achieve the above-described object, a recording apparatus according to a first aspect of the present invention includes: a recording head including an actuator and operable to perform recording on a recording medium by an operation of the actuator; a head holder holding the recording head; a circuit board including a heat-conductive substrate and provided on the head holder; a drive circuit operable to drive the actuator; a flexible wiring member on which the drive circuit is mounted and which connects the circuit board and the actuator such that a signal outputted from the circuit board is transmitted to the actuator via the drive circuit; and a radiator plate provided on the head holder, held in heat conductive contact with the drive circuit, and also held in heat conductive contact with the circuit board.

In the recording apparatus according to the first aspect of the present invention, the radiator plate is held in contact with the drive circuit mounted on the flexible wiring member such that the heat can be conducted from the drive circuit to the radiator plate. Further, the head-side circuit board having a heat-conducting substrate is held in contact with the radiator plate such that the heat can be conducted from the radiator plate to the head-side circuit board. Therefore, the heat generated in the drive circuit is transmitted not only to the radiator plate but also to the head-side circuit board. In this arrangement, the head-side circuit board also functions as a second radiator plate. That is, the existent head-side circuit board is also used as a radiator member, thereby enabling the heat generated in the drive circuit to be effectively radiated without upsizing the radiator plate held in contact with the drive circuit, and further, without upsizing the head holder and an entirety of the recording apparatus.

To achieve the above-described object, a recording apparatus according to a second aspect of the present invention includes: a recording head including an actuator and operable to perform recording on a recording medium by an operation of the actuator; a head holder holding the recording head; a circuit board provided on the head holder; a drive circuit operable to drive the actuator; a flexible wiring member on which the drive circuit is mounted and which connects the circuit board and the actuator such that a signal outputted from the circuit board is transmitted to the actuator via the drive circuit; and a flexible heat-conveying body provided on the head holder such that at least a part of the flexible heat-conveying body is disposed along the flexible wiring member and held in heat conductive contact with the drive circuit.

In the recording apparatus according to the second aspect of the present invention, the radiator plate is held in contact with the drive circuit mounted on the flexible wiring member such that the heat can be conducted from the drive circuit to the radiator plate. Further, the flexible heat-conveying body having flexibility and heat conductivity is held in contact with the radiator plate such that the heat can be conducted from the radiator plate to the flexible heat-conveying body. It is noted that the flexible heat-conveying body includes at least a portion extending along the flexible wiring member. That is, a narrow space in which the flexible wiring member is disposed is utilized for disposing the flexible heat-conveying body, thereby enabling the heat generated in the drive circuit to be effectively radiated without upsizing the head holder and the entirety of the recording apparatus.

BRIEF DESCRIPTION OF THE DRAWINGS

The above and optional objects, features, and advantages of the present invention will be better understood by reading the following detailed description of preferred embodiments of the invention when considered in conjunction with the accompanying drawings, in which.

DETAILED DESCRIPTION OF THE PREFERRED EMBODIMENTS

Hereinafter, there will be described a first preferred embodiment of the present invention with reference to FIGS. 1-4.

Figure 1:
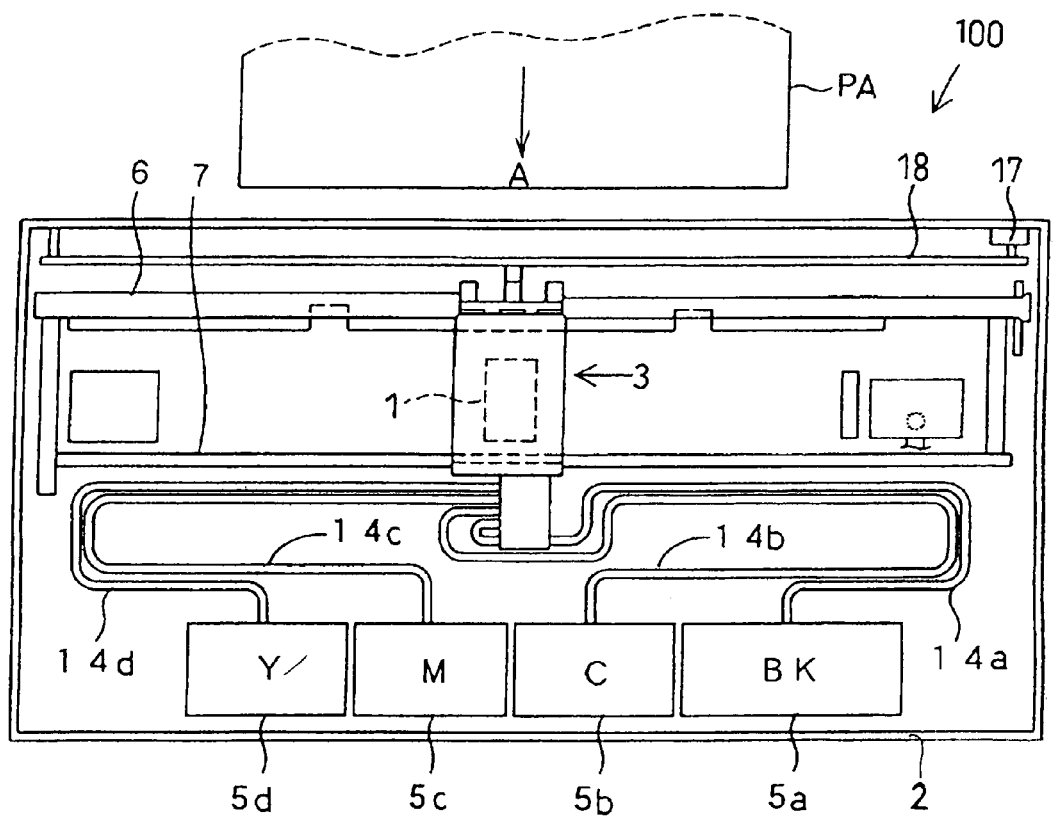
FIG. 1 is a plan view showing an inkjet recording apparatus according to the present invention.
Figure 1:
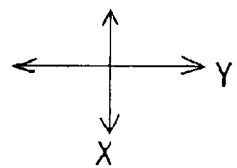

FIG. 1 shows an example in which the recording apparatus according to the present invention is embodied in an inkjet recording apparatus 100. The inkjet recording apparatus 100 in the first embodiment can be applied, for instance, not only as an independent printer device, but also as a printer function of a Multi Function Device (MFD) which includes a copier function, a scanner function, a facsimile function, etc. Inside a body-frame 2 of the inkjet recording apparatus 100, there is provided a carriage 3 equipped with a recording head 1 for ejecting ink onto a sheet PA as a recording medium such that recording is performed thereon.

In the body-frame 2, the carriage 3 is slidably placed on or supported by a rear guide shaft 6 and a front guide shaft 7 which are provided in parallel to each other and which extend in a main scanning direction of the carriage 3 (i.e., in a Y-axis direction). Owing to a carriage-driving motor 17 provided in a right rear side portion of the body-frame 2 and a timing belt 18 as an endless belt, the carriage 3 is reciprocated in the main scanning direction (i.e., in the Y-axis direction). Inks are supplied from respective ink-supply sources (i.e., ink tanks) 5a-5d stably provided in the body-frame 2 to a side thereof in which the carriage 3 is provided (hereinafter, just referred to a "carriage 3-side"), via respective ink-supply tubes 14a-14d. In the inkjet recording apparatus 100 of the first embodiment, there are provided four color inks, e.g., a yellow ink (Y), a magenta ink (M), a cyan ink (C) and a black ink (Bk).

The sheet PA is horizontally fed by a known sheet-feeding mechanism (not shown) below a lower surface of the recording head 1 in a sub scanning direction (i.e., in an X-axis direction or a direction indicated by an arrow A shown in FIG. 1) perpendicular to the main scanning direction (i.e., the Y-axis direction). Inks are ejected downward onto the sheet PA from a plurality of nozzles (not shown) each opening in the lower surface of the recording head 1 which is moved in the main scanning direction (i.e., in the Y-axis direction), so that the recording is performed on the sheet PA. It is noted that, throughout the description, a side or a surface of each component of the inkjet recording apparatus 100 corresponding to a surface (side) of the recording head 1 in which the nozzles open will be referred to as "a front surface (side)" or "a lower surface (side)". Further, a surface (side) of each component of the inkjet recording apparatus 100 corresponding to a surface (side) of the recording head 1 which is opposite to the front surface (side) thereof will be referred to as "a back surface (side)" or "an upper surface".

Figure 2:
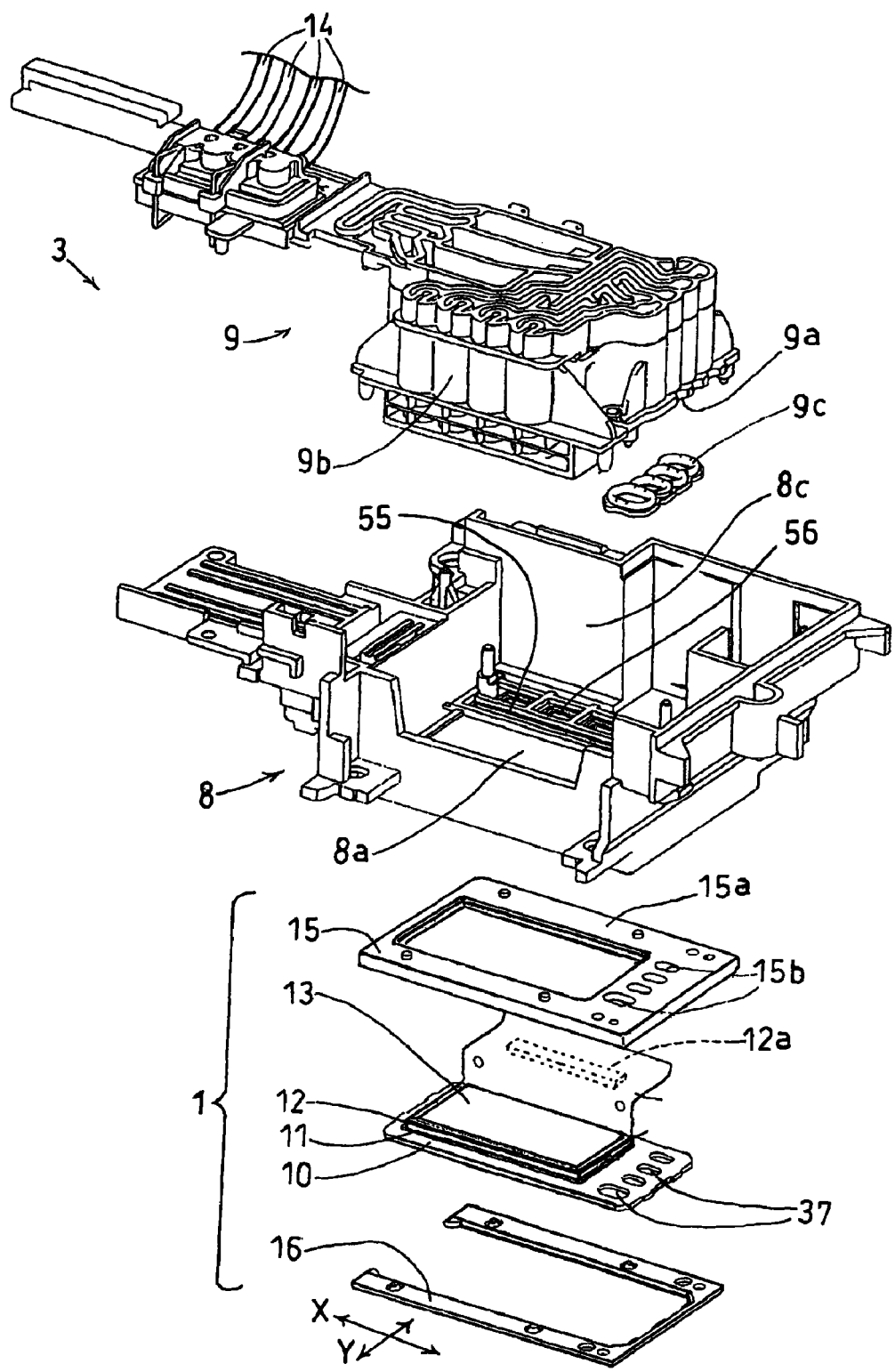
FIG. 2 is an exploded perspective view showing a carriage.
Figure 3:
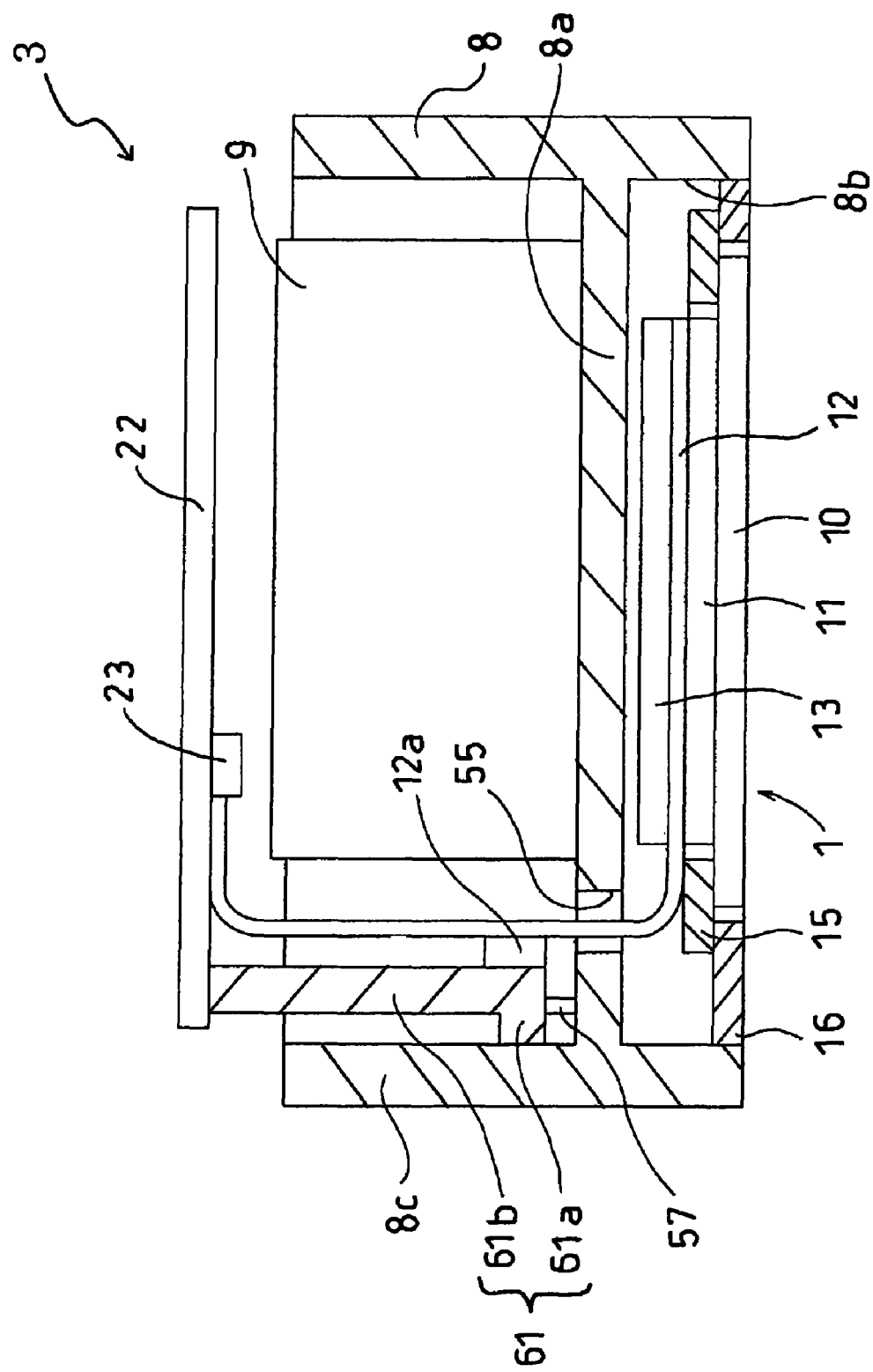
FIG. 3 is a cross-sectional view showing a carriage in a first embodiment taken along a line extending in a Y-axis direction.

As shown in FIGS. 2 and 3, the carriage 3 includes a head holder 8 having a generally box-like shape which opens upward. On a back side of the head holder 8, there are mounted a head-side circuit board 22 (i.e., a circuit board) and a damper device 9. On a lower side of a bottom plate 8a of the head holder 8, a concave portion 8b is formed so as to open downward. The recording head 1 is fixed to the concave portion 8b such that the nozzles are exposed downward and such that the recording head 1 is almost parallel to the bottom plate 8a.

The recording head 1 has a laminar structure in which a cavity portion 10, an actuator 11 and a flexible wiring member 12 are stacked on each other. The cavity portion 10 includes the plurality of nozzles each opening in a lower surface thereof and ink channels therein. The actuator 11 selectively applies an ejection pressure to ink accommodated in each of pressure chambers of the cavity portion 10. The flexible wiring member 12 transmits drive signals, to the actuator 11, from a later-described drive IC-chip 12a as a drive circuit. On the front side of the recording head 1, there is provided a front frame 16 so as to surround an outer circumference of the recording head 1. Further, on the back side of the recording head 1, there are provided a heat-conducting plate 13 and a reinforcing frame 15. The recording head 1 is fixed to the bottom plate 8a with the above-described constituent parts of the recoding head 1.

In the head holder 8, the head-side circuit board 22 is provided at a position in which the head-side circuit board 22 is overlapped with the recording head 1 in a plan view as seen in a direction from the back side of the head holder 8 (toward a front side thereof). The head-side circuit board 22 includes a substrate and an electrical circuit formed in the substrate. The head-side circuit board 22 is connected to an external signal source, i.e., a body-side substrate (not shown) provided in the body-frame 2, via another flexible wiring member (not shown). The recording head 1 and the head-side circuit board 22 are connected to each other via the flexible wiring member 12. It is noted that the head-side circuit board 22 is disposed so as to cover an upper opening of the head holder 8 which opens upward, and is fixed to an upper end of one of side walls of the head holder 8 by a supporting member (not shown).

On an upper side of the bottom plate 8a of the head holder 8, there is provided, between the recording head 1 and the head-side circuit board 22, the damper device 9 for accommodating the inks supplied to the carriage 3-side. An inner space of the damper device 9 is divided into a plurality of ink chambers each of which is for accommodating one of the different color inks supplied via a corresponding one of the ink-supply tubes 14a-14d. The damper device 9 includes air-discharging valve device 9b for removing air bubbles remaining in the ink accommodated in each of the ink chambers and ink outlets 9a for supplying the respective inks to the recording head 1.

An opening (not shown) is formed through the bottom plate 8a of the head holder 8. As shown in FIG. 2, inside of the opening, the ink outlets 9a provided in the damper device 9 and ink inlets 37 provided in the recording head 1 are connected to each other, respectively, via respective connecting holes 15b provided in the reinforcing frame 15 and an elastic seal member 9c, whereby the different color inks are supplied independently of one another from the damper device 9 to the recording head 1. As shown in FIGS. 2 and 3, in one of opposite end portions (which is close to a side plate 8*c*) of the bottom plate 8*a* of the head holder 8, there is formed, through the bottom plate 8a, a slit 55 for inserting the flexible wiring member 12 therethrough from a front side thereof to a back side thereof. Further, in both of the opposite end portions (which are respectively close to the side plate 8*c* and another side plate facing the side plate 8*c*, not shown) of the bottom plate 8*a*, there are provided through holes 56 for pouring, therethrough, an adhesive 19 which is for fixing the recording head 1 to the front side of the bottom plate 8*a*.

As in a known cavity portion disclosed by Japanese Unexamined Patent Application Publications Nos. 2001-246744 and 2005-313428, for example, in the cavity portion 10, each of the inks individually supplied to the respective ink inlets 37 (which are exposed in one of the opposite end portions of the upper surface of the cavity portion 10 in the X-axis direction) is portioned among a plurality of pressure chambers (not shown) via a manifold chamber (not shown). The ejection pressure is selectively applied to each of the pressure chambers by an operation of drive portions each as an active portion of the actuator 11, whereby inks are effectively ejected from the nozzles connected to the respective pressure chambers.

Figure 4:
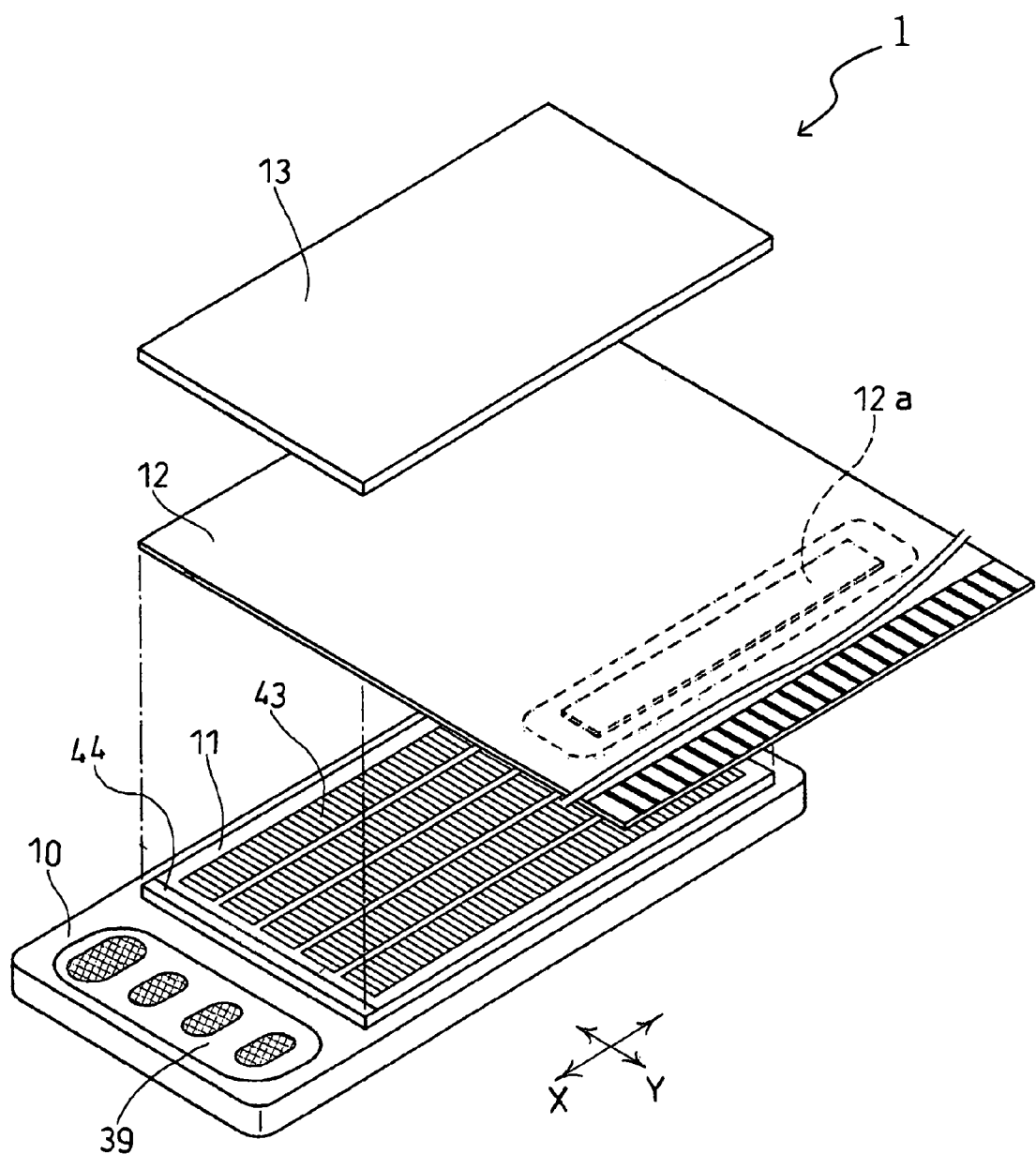
FIG. 4 is an exploded perspective view showing a recording head in the first embodiment.

Further, in the present embodiment, like a known actuator disclosed by a Japanese Unexamined Patent Application Publication No. 2005-322850, for example, the actuator 11 includes a plurality of ceramics layers which are stacked on each other in a direction perpendicular to planes thereof (i.e., in a vertical direction) and inner electrodes (not shown) each interposed between adjacent two of the ceramics layers. In each of the ceramic layers, there are formed the active portions each in an area vertically interposed between adjacent two of the inner electrodes. Described in detail, one active portion is formed in an area vertically interposed between one of a plurality of inner individual electrodes each corresponding to the respective pressure chambers and one inner common electrode common to the plurality of pressure chambers. As shown in FIG. 4, on an upper surface of the actuator 11, there are formed external individual terminals 43 and an external common terminal 44. Each of the external individual terminals 43 is connected, via a corresponding one of electric through holes, to a corresponding one of the inner individual electrodes. The external common terminal 44 is connected to the inner common electrode. Each of the active portions is deformed due to a drive-pulse signal applied to the corresponding external individual terminal 43, whereby the ejection pressures are selectively applied to the plurality of pressure chambers. Each of the external individual terminals 43 is individually and electrically connected to a corresponding one of terminals (not shown) of respective signal wires formed in the flexible wiring member 12. The external common terminal 44 is electrically connected to a terminal (not shown) of a common-electric-potential wire formed in the flexible wiring member 12.

The reinforcing frame 15 is provided for reinforcing the cavity portion 10, has a frame-like shape, and is made of a material (e.g., a metal plate such as an SUS) having a higher rigidity than the cavity portion 10. An outer size of the reinforcing frame 15 is larger than that of the cavity portion 10 in a plan view. The reinforcing frame 15 is put on and adhered to the back surface of the cavity portion 10 so as to surround the actuator 11, thereby obviating a deformation or a distortion of the cavity portion 10 having a thin flat shape. The connecting holes 15*b* which respectively corresponding to the ink inlets 37 of the cavity portion 10 are formed through one of opposite end portions (as seen in the X-axis direction) of a frame portion 15*a* of the reinforcing frame 15.

The heat-conducting plate 13 is fixed to a back surface of the flexible wiring member 12 at a position corresponding to the actuator 11. The heat-conducting plate 13 is a flat rectangular plate (in the plan view) having a size as large as (an entirety of) the actuator 11. The heat-conducting plate 13 has higher heat conductivity (i.e., thermal conductivity) than the actuator 11 and the flexible wiring member 12, and is made of a material having a higher rigidity than the flexible wiring member 12, e.g., made of a metal plate such as an aluminum, a copper, the SUS, or the like. The heat-conducting plate 13 is stuck firmly to or adhered to the actuator 11 via the flexible wiring member 12 so that the heat generated in a local part of the actuator 11 is dissipated, thereby restraining unevenness in a distribution of the temperature of the actuator 11, effectively radiating the heat, and further increasing a rigidity of an entirety of a head unit 20. The heat-conducting plate 13, however, may be omitted where appropriate.

The front frame 16 is a flat plate member having a U-shape in the plan view. The front frame 16 is disposed so as to surround the cavity portion 10, and fixed to a front surface of the reinforcing frame 15, as shown in FIGS. 2 and 3. Owing to the front frame 16, a step height between a nozzle surface (i.e., the lower surface) of the cavity portion 10 and a frame of the head holder 8 is eliminated, whereby a wiping member, etc., is prevented to be caught (by the step height) when the nozzle surface is cleaned.

As shown in FIG. 4, one of opposite end portions (as seen in a longitudinal direction, i.e., in the Y-axis direction) of the flexible wiring member 12 is electrically connected to the actuator 11. The other of the opposite end portions of the flexible wiring member 12 is connected to a connector 23 provided on the head-side circuit board 22 so as to be attachable thereto and detachable therefrom. On a surface of the flexible wiring member 12 which faces the actuator 11 (hereinafter, referred to as "a back side surface"), there are provided the terminals, not shown, each of which is to be electrically connected to one of a corresponding one of the external individual terminals 43 and a corresponding one of the external common terminal 44. The drive IC-chip 12*a* is mounted on a portion of the back surface of the flexible wiring member 12, which portion extends from the actuator 11. The drive IC-chip 12*a* is provided for inputting a print signal from the head-side circuit board 22 to the actuator 11.

As shown in FIG. 3, the flexible wiring member 12 is inserted, via the slit 55 of the bottom plate 8*a*, into an inside of the head holder 8 from a front side of the bottom plate 8*a*, and the drive IC-chip 12*a* is held in heat conductive contact with a later-described radiator plate 61. Further, the flexible wiring member 12 extends along an inner surface of the side plate 8*c* of the head holder 8 toward the back side thereof, and is connected to the connecter 23 of the head-side circuit board 22 so as to be attachable thereto and detachable therefrom. Owing to the above-described construction, the flexible wiring member 12 can be drawn in the head holder 8 in a compact manner.

The drive IC-chip 12*a* is mounted on the flexible wiring member 12 in an area thereof opposed to the inner surface of the side plate 8*c* of the head holder 8 so as to face the side plate 8*c*. It is preferred that the drive IC-chip 12*a* is disposed in a vicinity of the actuator 11 to avoid a resistance of signal wires being increased since the signal wires through which signals are outputted from the drive IC-chip 12*a* to a plurality of the terminals provided in the actuator 11 tend to be fine and provided in high density. Therefore, the drive IC-chip 12*a* is disposed inside the head holder 8.

Next, there will be described the radiator plate 61. The radiator plate 61 is provided for radiating heat generated in the drive IC-chip 12a mounted on the flexible wiring member 12 to an outside of the head holder 8, and made of a material having a good electrical conductivity (e.g., a metal such as the aluminum, the copper, the SUS, or the like). The radiator plate 61 includes a seat portion 61a which is parallel to the bottom plate 8a of the head holder 8 and a wall portion 61b which vertically extends from the seat portion 61a so as to be perpendicular thereto. The radiator plate 61 is disposed such that the wall portion 61b is parallel to the side plate 8c of the head holder 8, namely, the wall portion 61b is perpendicular to a front face and a back face of the head holder 8, and such that an upper end portion of the radiator plate 61 is located in a vicinity of the upper opening of the head holder 8. Further, the radiator plate 61 is held in heat conductive contact with the head-side circuit board 22.

That is, the radiator plate 61 is disposed such that the radiator plate 61 and the head-side circuit board 22 disposed in the back side of the head holder 8 intersect with each other. A projection 57 upwardly projecting from the bottom plate 8a of the head holder 8 is inserted into a fitting hole (not shown) provided in the seat portion 61a of the radiator plate 69, so that the seat portion 61a is fixed to the head holder 8. The drive IC-chip 12a mounted on the flexible wiring member 12 is disposed to be held in heat conductive contact with the wall portion 61b. It is noted that the drive IC-chip 12a may be adhered to the wall portion 61b, or may be pressed by an elastic member (not shown) fixed to the head holder 8. Further, the drive IC-chip 12a is mounted on the flexible wiring member 12 not only in the area thereof opposed to the side plate 8c of the head holder 8, but may be in an area opposed to the bottom plate 8b thereof, as long as the drive IC-chip 12a is held in heat conductive contact with the radiator plate 61 according to a figure of the radiator plate 61.

The head-side circuit board 22 includes the plate-like substrate having a high rigidity and the electrical circuit which is formed thereon. The substrate is made of a material including, as a constituent thereof, a carbon composite material such as graphite to increase a heat conductivity of the substrate. The substrate has an electric insulation property with respect to the electrical circuit to avoid short-circuiting of the electrical circuit via the substrate. In order to increase the heat conductivity of the substrate, the substrate may be made of a material including, as a constituent thereof, a metal, in place of the carbon composite material. In this case, the head-side circuit board 22 may be formed such that an electric insulating layer is reliably interposed between the electrical circuit and the substrate.

A lower surface of the head-side circuit board 22 and an upper surface of the wall portion 61b of the radiator plate 61 are held in contact with each other such that the head-side circuit board 22 and the wall portion 61b are perpendicular to each other. The heat generated in the drive IC-chip 12a is conveyed to the head-side circuit board 22 via the radiator plate 61, whereby the heat is also radiated from the head-side circuit board 22. That is, the existent head-side circuit board 22 also functions as a second radiator plate, thereby securing the heat capacity required for radiating without upsizing the radiator plate 61.

Therefore, even if an amount of the heat generated in the drive IC-chip 12a is increased due to an increase in the number of the nozzles and the like, the heat can be sufficiently radiated without upsizing the head holder 8 and an entirety of the inkjet recording apparatus 100. Accordingly, a malfunction or a break-down of the drive IC-chip 12a can be obviated.

Figure 5:
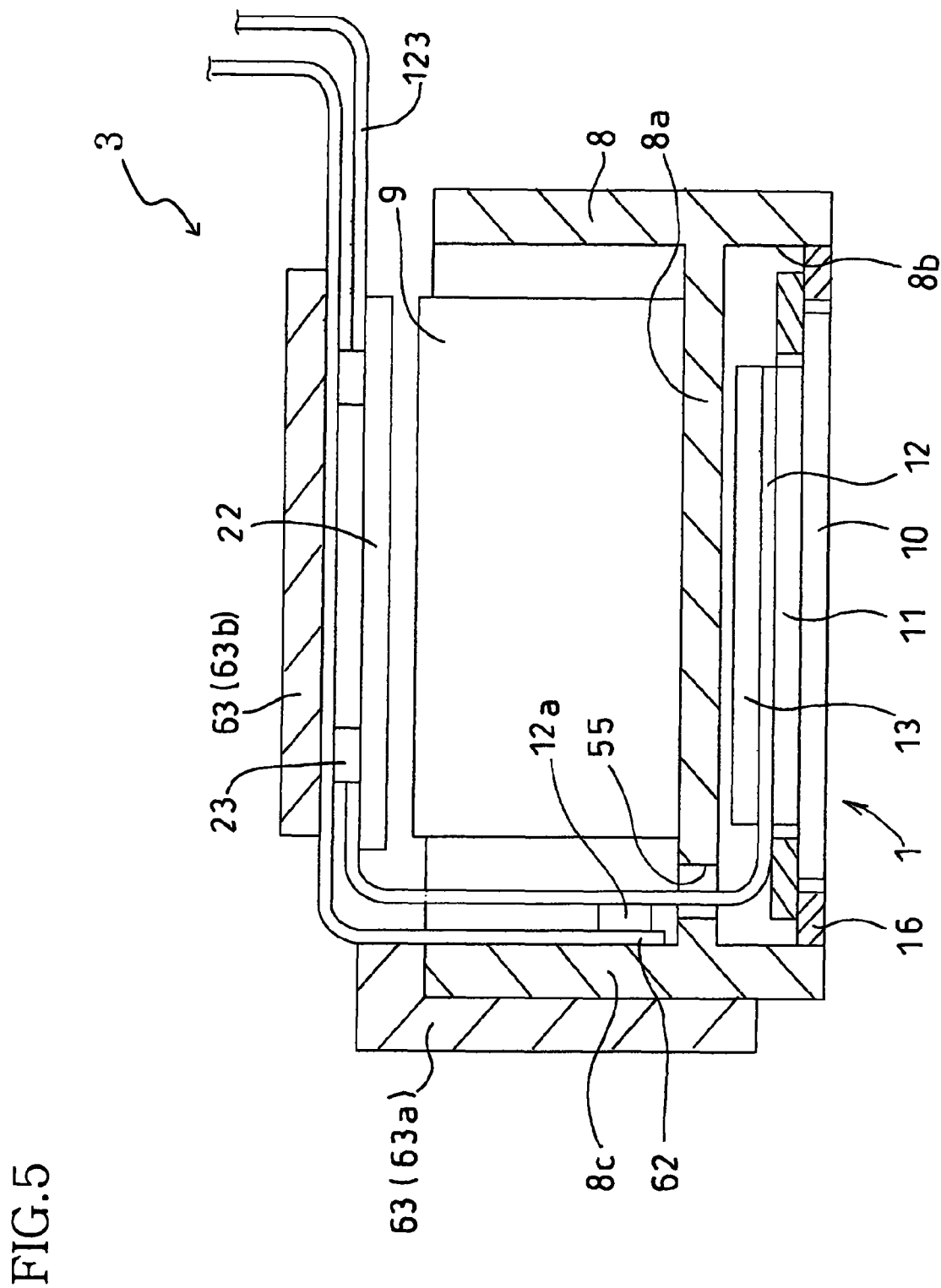
FIG. 5 is a cross-sectional view showing a carriage in a second embodiment taken along a line extending in the Y-axis direction.

Next, there will be described a second preferred embodiment of the present invention with reference to FIG. 5.

Unlike the recording apparatus 100 according to the first embodiment in which the plate-like radiator plate 61 is held in contact with the drive IC-chip 12a mounted on the flexible wiring member 12, a recording apparatus according to the second embodiment has a construction in which a heat-conveying body 62, i.e., a flexible heat-conveying body, having the heat conductivity and a flexibility is held in contact with the drive IC-chip 12a such that heat is radiated therefrom.

The heat-conveying body 62 is a sheet-like belt-type member having the heat conductivity and the flexibility, and provided so as to extend along the flexible wiring member 12 from a position in which the heat-conveying body 62 contacts with the drive IC-chip 12a toward an upstream side in a direction of signal flow (i.e., toward a signal source), namely, to extend in a direction away from the recording head 1. Further, the heat-conveying body 62 has a width which is almost the same as a width of the belt-type flexible wiring member 12, and is overlapped with the flexible wiring member 12 so as to extend along the same 12. However, the heat-conveying body 62 may have a width larger than the width of the flexible wiring member 12, so that the flexible wiring member 12 is tucked into the heat-conveying body 62.

As is the case with the first embodiment, inside the head holder 8, the flexible wiring member 12 is drawn from the front side of the head holder 8 toward the back side thereof so as to extend along the inner surface of the side plate 8c. The heat-conveying body 62 can be freely bent, owing to its flexibility, so as to extend along the flexible wiring member 12, whereby the heat-conveying body 62 can be disposed by effectively utilizing a narrow space left in the head holder 8 by drawing the flexible wiring member 12. As a result, the heat-conveying body 62 can be disposed without increasing the size of the head holder 8.

A dimension of the heat-conveying body 62 in a longitudinal direction thereof (i.e., a longitudinal direction of the flexible wiring member 12) can be properly set according to the heat capacity required for the heat-conveying body 62, namely, according to an amount of heat generated in the drive IC-chip 12a.

Further, the recording apparatus according to the second embodiment includes: (a) a flexible wiring member 123 provided on an upstream side in the direction of signal flow for connecting an external signal source (not shown) and the head-side circuit board 22; and (b) the flexible wiring member 12 provided on a downstream side in the direction for connecting the head-side circuit board 22 and the actuator 11, which flexible wiring members 123, 12 collaborating with each other for transmitting signals from the external signal source (not shown) to the actuator 11. Thus, owing to the flexibility, the heat-conveying body 62 may be configured to extend, by being freely bent, not only up to an area where the heat-conveying body 62 is overlapped with the flexible wiring member 12 provided on the downstream side, but also up to an area where the heat-conveying body 62 is overlapped with the head-side circuit board 22 or where the heat-conveying body 62 is overlapped with the flexible wiring member 123 provided in the upstream side. It is possible to further effectively prevent heat from being conducted to the recording head 1 since the heat-conveying body 62 extends in a direction away from the recording head 1, thereby further effectively obviating a malfunction of the recording head 1 caused by the heat.

As the heat-conveying body 62, it is preferable to adopt, for instance, "3M™ Hyper-Soft Thermal Pad" produced by SUMITOMO 3M LIMITED and made of a silicone-type material, "F-Co™ Sheet" produced by THE FURUKAWA ELECTRIC CO., LTD. and made of an acrylic-rubber type material (i.e., a non-silicone type material), the high-thermal-conductivity sheet produced by Btech corp., U.S.A., and made of a material in which an aluminum and a carbon graphite material, etc., are added in order to increase the heat conductivity, or the like. Further, there may be adopted a heat-conveying body having a shield effect against an electromagnetic wave, thereby effectively reducing noises radiated from the flexible wiring member 12. Further, there may be adopted a heat-conveying body having an adhesive layer on a single side, namely, in which a single side is a tape-type, or there may be adopted a heat-conveying body having adhesive layers on both sides, namely, in which both sides are the tape-type, thereby increasing the stability for disposing the heat-conveying body.

Further, a heat-conveying body extending along the flexible wiring member 123 provided on the upstream side may be connected to a metal component provided on the body-frame 2, whereby heat can be more effectively radiated by the heat-conveying body.

If the heat-conveying body 62 does not satisfy a heat capacity required for radiating heat generated in the drive IC-chip 12a, there may be disposed a plate-like radiator plate 63 made of a material having an excellent heat conductivity, e.g., the aluminum, etc., so as to be held in contact with the heat-conveying body 62, whereby heat can be more effectively radiated. By way of example, FIG. 5 shows a state in which the radiator plate 63a is held in contact with the heat-conveying body 62 in an area thereof extending along the inner surface of the side plate 8c of the head holder 8 and in which a radiator plate 63b is held in contact with the heat-conveying body 62 in an area thereof extending along the head-side circuit board 22. The radiator plate 63a is provided so as to extend from a portion thereof held in contact with the heat-conveying body 62 along an outer surface of the side plate 8c and be exposed to an outside thereof. The radiator plate 63b is provided so as to be exposed to the back side of the head holder 8. Further, as in the first embodiment, the head-side circuit board 22 may be made of a material having an excellent heat conductivity.

As described above, in the second embodiment, since the radiator plate 63 is held in contact with an arbitrary portion of the heat-conveying body 62, it is possible to increase a degree of freedom in designing the radiator plate 63 in terms of a disposition and a configuration thereof Therefore, the radiator plate 63 is freely disposed at a position where heat can be more effectively radiated by the radiator plate 63 or at a position where the radiator plate 63 does not interfere with other components of the head holder 8, whereby heat can be effectively radiated to a high degree, owing to collaboration between the heat-conveying body 62 and the radiator plate 63, while avoiding upsizing of the head holder 8.

It is noted that, in the above-described embodiments, there has been described a case in which the present invention is applied to an inkjet-type recording apparatus. However, the present invention may be applied to a recording apparatus which is an inkpact-type, etc, as long as the recording apparatus includes a plurality of recording elements and drive portions respectively corresponding to the recording elements.

What is claimed is:

1. A recording apparatus, comprising:
   a recording head including an actuator and operable to perform recording on a recording medium by an operation of the actuator;
   a head holder holding the recording head;
   a circuit board including a heat-conductive substrate and provided on the head holder;
   a drive circuit operable to drive the actuator;
   a flexible wiring member on which the drive circuit is mounted and which connects the circuit board and the actuator such that a signal outputted from the circuit board is transmitted to the actuator via the drive circuit; and
   a radiator plate provided on the head holder, held in heat conductive contact with the drive circuit, and also held in heat conductive contact with the circuit board.

2. The recording:apparatus according to claim 1, wherein one of the radiator plate and the circuit board is held in contact, at one of opposite end portions thereof, with the other of the radiator plate and the circuit board.

3. The recording apparatus according to claim 1, wherein the radiator plate is disposed between the recording head and the circuit board along the flexible wiring member.

4. The recording apparatus according to claim 3,
   wherein the recording head is held on a front side of the head holder, which front side is opposed to the recording medium, and the circuit board is disposed on a back side of the head holder, which back side is opposite to the front side thereof, and
   wherein the flexible wiring member includes a portion which extends along a periphery portion of the head holder between the front side and the back side thereof, and the drive circuit is mounted on the portion of the flexible wiring member.

5. The recording apparatus according to claim 4, wherein the circuit board is disposed generally in parallel with the recording head.

6. The recording apparatus according to claim 4, wherein the radiator plate is disposed so as to extend in a direction intersecting with a direction in which the circuit board extends.

7. The recording apparatus according to claim 4, wherein the radiator plate is disposed inside the head holder.

8. The recording apparatus according to claim 4, wherein the circuit board is disposed at a position in which the circuit board is overlapped with the recording head as seen in a direction from the front side of the head holder to the back side thereof.

9. The recording apparatus according to claim 1, wherein the heat-conductive substrate of the circuit board includes, as a constituent thereof, a carbon composite material and has an electric insulation property.

10. The recording apparatus according to claim 1, wherein the heat-conductive substrate of the circuit board includes, as a constituent thereof, a metal and has an electric insulation property.

11. A recording apparatus, comprising:
    a recording head including an actuator and operable to perform recording on a recording medium by an operation of the actuator;
    a head holder holding the recording head;
    a circuit board provided on the head holder;
    a drive circuit operable to drive the actuator;
    a flexible wiring member on which the drive circuit is mounted and which connects the circuit board and the actuator such that a signal outputted from the circuit board is transmitted to the actuator via the drive circuit; and
    a flexible heat-conveying body provided on the head holder such that at least a part of the flexible heat-conveying body is disposed along the flexible wiring member and held in heat conductive contact with the drive circuit.

12. The recording apparatus according to claim 11, further comprising at least one radiator plate provided on the head holder and held in heat conductive contact with the flexible heat-conveying body.

13. The recording apparatus according to claim 12, wherein a number of the at least one radiator plate corresponds to a heat capacity which is required for radiating heat generated in the drive circuit.

14. The recording apparatus according to claim 11, wherein the flexible heat-conveying body includes a portion extending along the circuit board.

15. The recording apparatus according to claim 11, further comprising a second flexible wiring member which connects the circuit board to an external signal source, in addition to the flexible wiring member as a first flexible wiring member,
wherein the flexible heat-conveying body includes a portion extending along the second flexible wiring member.

16. The recording apparatus according to claim 11,
wherein the recording head is held on a front side of the head holder, which front side is opposed to the recording medium, and the circuit board is provided on a back side of the head holder, which back side is opposite to the front side thereof, and
wherein the flexible wiring member includes a portion which extends along a periphery portion of the head holder between the front side and the back side thereof, and the drive circuit is mounted on the portion of the flexible wiring member.

17. The recording apparatus according to claim 16, wherein the circuit board is disposed generally in parallel with the recording head.

18. The recording apparatus according to claim 16, wherein the circuit board is disposed at a position in which the circuit board is overlapped with the recording head as seen in a direction from the front side of the head holder to the back side thereof.

19. The recording apparatus according to claim 11, wherein the drive circuit and the flexible heat-conveying body are held in heat conductive contact with each other inside the head holder.

20. The recording apparatus according to claim 19, wherein the flexible heat-conveying body includes a portion which extends outwardly from the head holder.

* * * * *